(12) United States Patent
Wu et al.

(10) Patent No.: US 11,529,702 B2
(45) Date of Patent: Dec. 20, 2022

(54) DISPLAY PANEL AND CUTTING METHOD THEREFOR, DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiaoping Wu, Beijing (CN); Chuan Li, Beijing (CN); Bo Wang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 154 days.

(21) Appl. No.: 16/638,609

(22) PCT Filed: Oct. 31, 2018

(86) PCT No.: PCT/CN2018/112999
§ 371 (c)(1),
(2) Date: Feb. 12, 2020

(87) PCT Pub. No.: WO2019/096006
PCT Pub. Date: May 23, 2019

(65) Prior Publication Data
US 2020/0171606 A1  Jun. 4, 2020

(30) Foreign Application Priority Data
Nov. 15, 2017 (CN) .......................... 201711131958.4

(51) Int. Cl.
*B23K 26/38* (2014.01)
*B23K 26/0622* (2014.01)
(Continued)

(52) U.S. Cl.
CPC .......... *B23K 26/38* (2013.01); *B23K 26/0624* (2015.10); *H05K 3/0026* (2013.01); *B23K 2101/42* (2018.08)

(58) Field of Classification Search
CPC .......................... B23K 26/38; B23K 26/0624; B23K 2101/42; H05K 3/0026
See application file for complete search history.

(56) References Cited

U.S. PATENT DOCUMENTS

2013/0193617 A1* 8/2013 Zhang .................... B23K 26/38
264/400
2016/0338204 A1* 11/2016 McMullen ............. B23K 26/38
(Continued)

FOREIGN PATENT DOCUMENTS

CN  101093333 A   12/2007
CN  101435923 A * 5/2009
(Continued)

OTHER PUBLICATIONS

International Search Report and Written Opinion issued in corresponding International Application No. PCT/CN2018/112999, dated Jan. 30, 2019, with English language translation.
(Continued)

*Primary Examiner* — Binh X Tran
(74) *Attorney, Agent, or Firm* — McDermott Will & Emery LLP

(57) ABSTRACT

A cutting method for a display panel, wherein the cutting method includes: cutting a display motherboard to be cut into a plurality of separate display panels by using a first laser beam, wherein the display panels each include a plurality of leads disposed between conductive connectors and a cutting edge of the display panel formed after cutting by the first laser beam; and severing at least some leads of the display panel by using a second laser beam at a position on the display panel between the conductive connectors and the cutting edge of the display panel, the at least some leads being short-circuited leads.

7 Claims, 5 Drawing Sheets

(51) Int. Cl.
    *H05K 3/00*         (2006.01)
    *B23K 101/42*     (2006.01)

(56) References Cited

U.S. PATENT DOCUMENTS

| | | |
|---|---|---|
| 2018/0203267 A1 | 7/2018 | Wang et al. |
| 2019/0144325 A1* | 5/2019 | Bowden ................ B23K 26/53 219/121.69 |
| 2020/0171606 A1 | 6/2020 | Wu et al. |

FOREIGN PATENT DOCUMENTS

| | | | |
|---|---|---|---|
| CN | 101435923 A | | 5/2009 |
| CN | 102789072 A | | 11/2012 |
| CN | 106914707 A | * | 7/2017 |
| CN | 106914707 A | | 7/2017 |
| CN | 107331294 A | | 11/2017 |
| CN | 107855665 A | | 3/2018 |
| JP | H20232991 A | | 9/1990 |

OTHER PUBLICATIONS

First Chinese Office Action issued in corresponding Chinese Patent Application No. 201711131958.4, dated Dec. 3, 2018, with English language translation.
Non-Final Office Action issued in U.S. Appl. No. 17/135,501, dated Jun. 2, 2022.

* cited by examiner

DISPLAY PANEL AND CUTTING METHOD THEREFOR, DISPLAY DEVICE

CROSS-REFERENCE TO RELATED APPLICATIONS

This application is a national phase entry under 35 USC 371 of International Patent Application No. PCT/CN2018/112999 filed on Oct. 31, 2018, which claims priority to Chinese Patent Application No. 201711131958.4, filed with the Chinese Patent Office on Nov. 15, 2017, titled "A DISPLAY PANEL AND CUTTING METHOD THEREFOR, DISPLAY DEVICE", which are incorporated herein by reference in their entirety.

TECHNICAL FIELD

The present disclosure relates to the field of display technologies, and in particular, to a display panel and a cutting method therefor, and a display device.

BACKGROUND

In a process of manufacturing a single display panel, a display motherboard (or referred to as a large board) is first manufactured. Then, the display motherboard is cut into a plurality of separate display panels through a cutting process.

SUMMARY

In a first aspect, some embodiments of the present disclosure provide a cutting method for a display panel. The cutting method includes: cutting a display motherboard to be cut into a plurality of separate display panels by using a first laser beam, wherein the display panels each include a plurality of leads disposed between conductive connectors and a cutting edge of the display panel formed after cutting by the first laser beam; and severing at least some leads of the display panel by using a second laser beam at a position on the display panel between the conductive connectors and the cutting edge of the display panel, the at least some leads being short-circuited leads. In some embodiments of the present disclosure, energy of the second laser beam is less than energy of the first laser beam.

In some embodiments of the present disclosure, severing the at least some leads of the display panel by using the second laser beam at the position on the display panel between the conductive connectors and the cutting edge of the display panel, includes: severing all the leads by using the second laser beam at the position on the display panel between the conductive connectors and the cutting edge of the display panel, wherein severing positions of all the leads are severed are on a same straight line.

In some embodiments of the present disclosure, cutting the display motherboard to be cut into a plurality of separate display panels by using the first laser beam, includes: cutting the display motherboard to be cut into a plurality of separate display panels along cutting paths on the display motherboard by using the first laser beam.

In some embodiments of the present disclosure, a cutting direction of the second laser beam is perpendicular to an extending direction of the leads.

In some embodiments of the present disclosure, a cutting depth of the second laser beam is greater than or equal to a thickness of the leads, and is less than a sum of the thickness of the leads and a thickness of a base film layer on which the conductive connectors and the leads are formed.

In some embodiments of the present disclosure, the second laser beam is a pulsed laser beam.

In some embodiments of the present disclosure, the pulsed laser beam is a picosecond laser beam, a green laser beam or an ultraviolet laser beam.

In some embodiments of the present disclosure, the display motherboard to be cut is a flexible display motherboard, and the plurality of separate display panels are flexible display panels.

In a second aspect, some embodiments of the present disclosure provide a display panel. The display panel includes the conductive connectors, wherein the conductive connectors include bonding electrodes for bonding circuit structures, and/or detection terminals for electrical detection.

In some embodiments of the present disclosure, a thickness of cut leads is in a range of 1 μm to 2 μm.

In some embodiments of the present disclosure, one end of a cut lead is connected to one of the conductive connectors, and another end of the cut lead extends to the cutting edge formed after cutting by the first laser beam.

In a third aspect, some embodiments of the present disclosure provide a display device including the above display panel.

BRIEF DESCRIPTION OF THE DRAWINGS

In order to describe technical solutions in embodiments of the present disclosure or the prior art more clearly, the accompanying drawings to be used in the description of the embodiments or the prior art will be introduced briefly. Obviously, the accompanying drawings to be described below are merely some embodiments of the present disclosure, and a person of ordinary skill in the art may obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments obtained on a basis of the embodiments of the present disclosure by a person of ordinary skill in the art without paying any creative effort shall be included in the protection scope of the present disclosure.

It will be noted that, unless otherwise defined, all terms (including technical and scientific terms) used in some embodiments of the present disclosure have a same meaning as commonly understood by a person of ordinary skill in the art to which some embodiments of the present disclosure belongs. It will also be understood that, terms such as those defined in an ordinary dictionary should be interpreted as having meanings consistent with their meanings in the context of the related art, and should not be interpreted in an idealized or extremely formalized way unless explicitly defined herein.

For example, terms "first", "second" and similar terms used in the description and the claims of the present disclosure are not intended to represent any order, quantity or importance, and are merely used to distinguish different components. Word "include" or "comprise" or the like means that an element or item preceding the word covers an element or item enumerated after the word and its equivalent, without excluding other elements or items, Orientations or positional relationships indicated by terms "up/above", "down/below" and the like are based on the orientations or positional relationships shown in the accompanying drawings, and are merely for convenience of explanation of the technical solution of the present disclosure, and are not intended to indicate or imply that a referred device or component must have a particular orientation, and must be constructed and operated in a particular orientation. Therefore, they cannot be construed as limitations to the present disclosure.

Figure 1:
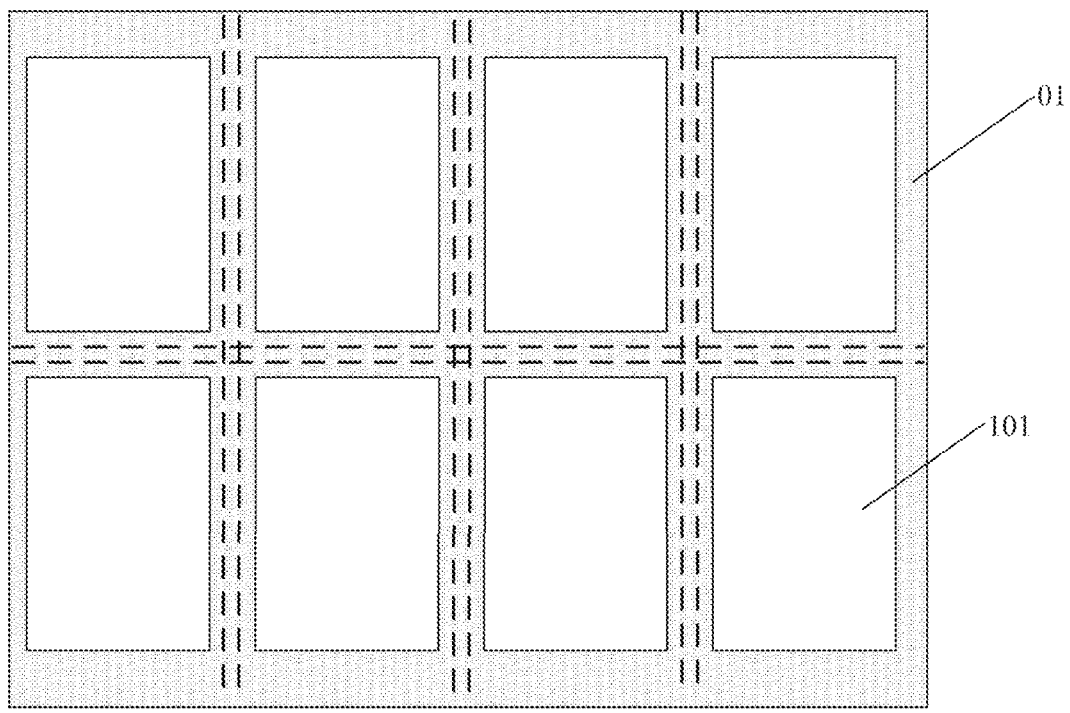
FIG. 1 is a schematic diagram showing a structure of a display motherboard, in accordance with some embodiments of the present disclosure.

As shown in FIG. 1, a display motherboard 01 has a plurality of display panels to be cut 101. Before the display motherboard is cut, in order to detect electrical performances of the display motherboard 01 manufactured by means of industrial mass production, as shown in FIG. 2, a plurality of conductive connectors 100 are provided in a partial region (marked as a in FIG. 2) of each display panel to be cut 101.

Figure 2:
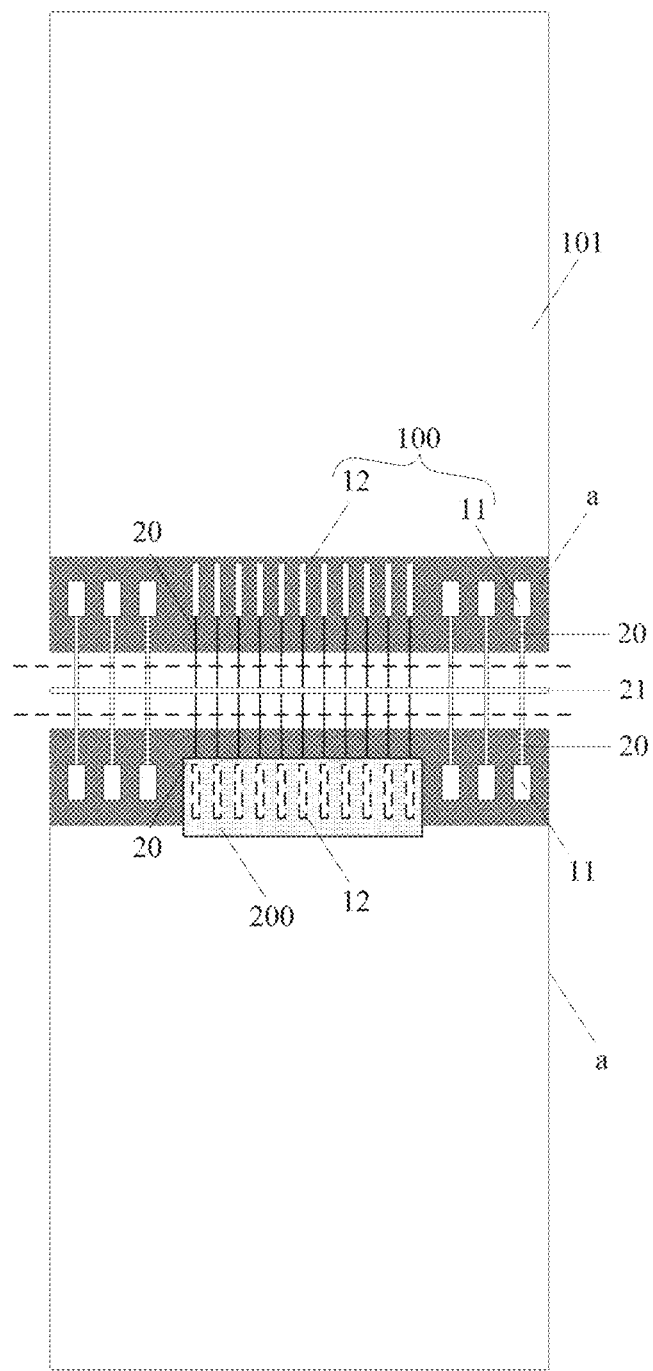
FIG. 2 is a schematic diagram showing a partial structure of the display motherboard in FIG. 1 and a laser cutting manner.

In some embodiments of the present disclosure, as shown in FIG. 2, the conductive connectors 100 may include detection terminals 11 for electrical detection and bumps for bonding a circuit structure 200 such as a chip on flex (COF), which may be referred to as bonding electrodes 12.

The bonding electrodes 12 and the detection terminals 11 are each connected to a lead 20. In some embodiments, the leads 20 are used for detecting the electrical performances of the display motherboard 01 before being cut.

In addition, in the display motherboard 01, a bus 21 is disposed between two adjacent display panels to be cut 101, so that leads 20 disposed on the two adjacent display panels to be cut 101 may be electrically connected together via the bus 21.

During a detection process, the COF is bonded to the bonding electrodes 12, and provides signals to the leads 20 via the bus 21. Then, probes are electrically connected to the detection terminals 11 to obtain detection signals, thereby achieving detection of the electrical performances of the display motherboard 01.

It will be noted that, the above embodiments are described by taking an example in which the conductive connectors 100 include the detection terminals 11 and the bonding electrodes 12. In some embodiments of the present disclosure, the conductive connectors 100 may include the detection terminals 11 or the circuit structure 200 such as the COF.

Figure 3:
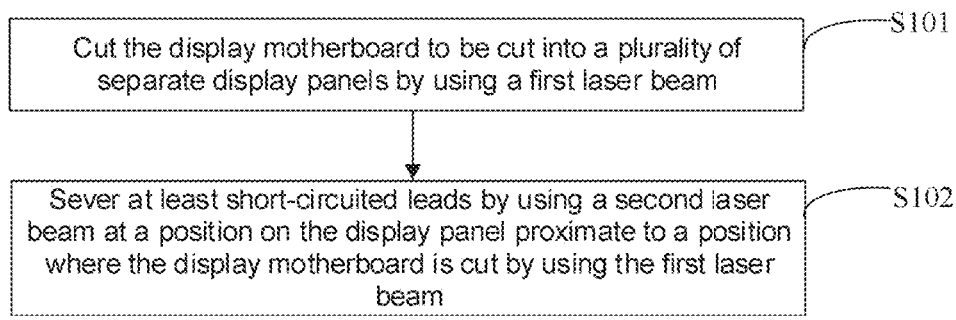
FIG. 3 is a flow diagram of a cutting method for a display panel, in accordance with some embodiments of the present disclosure.

After the detection process is finished, the display motherboard 01 is cut. A cutting method for a display panel provided by the embodiments of the present disclosure will be described in detail below. As shown in FIG. 3, the cutting method includes S101 and S102.

In S101, cut the display motherboard to be cut into a plurality of separate display panels 101 by using a first laser beam.

The display motherboard 01 is provided with cutting paths, such as laser cut lines shown by the dotted lines in FIG. 1 or FIG. 2, thereon. In this case, the display motherboard 01 may be cut along the cutting paths by using the first laser beam.

A manufacturing process of the display motherboard includes high-temperature processes. Therefore, a base of the display motherboard is usually made of a high-temperature resistant material, and a high-energy laser beam is required to cut the display motherboard. As a result, an edge of the base is melted after being subjected to the high-energy laser beam, and the edge of the cut base is carbonized in turn. In addition, leads 20 severed during the cutting process may generate metal debris at the cutting position, and the metal debris may be melted during the cutting process. In this way, on a display panel formed after cutting, a plurality of adjacent leads 20 may be welded together through molten metal debris, thereby resulting in short circuits of the leads 20, and display defects such as dark lines during a display process, and reducing a cutting yield.

The first laser beam may be various laser beams with high energy that are used for cutting the display motherboard 01, as long as it is able to cut an entire display motherboard 01 into a plurality of small display panels 101. The embodiments of the present disclosure do not limit a type of the first laser beam.

Figure 4:
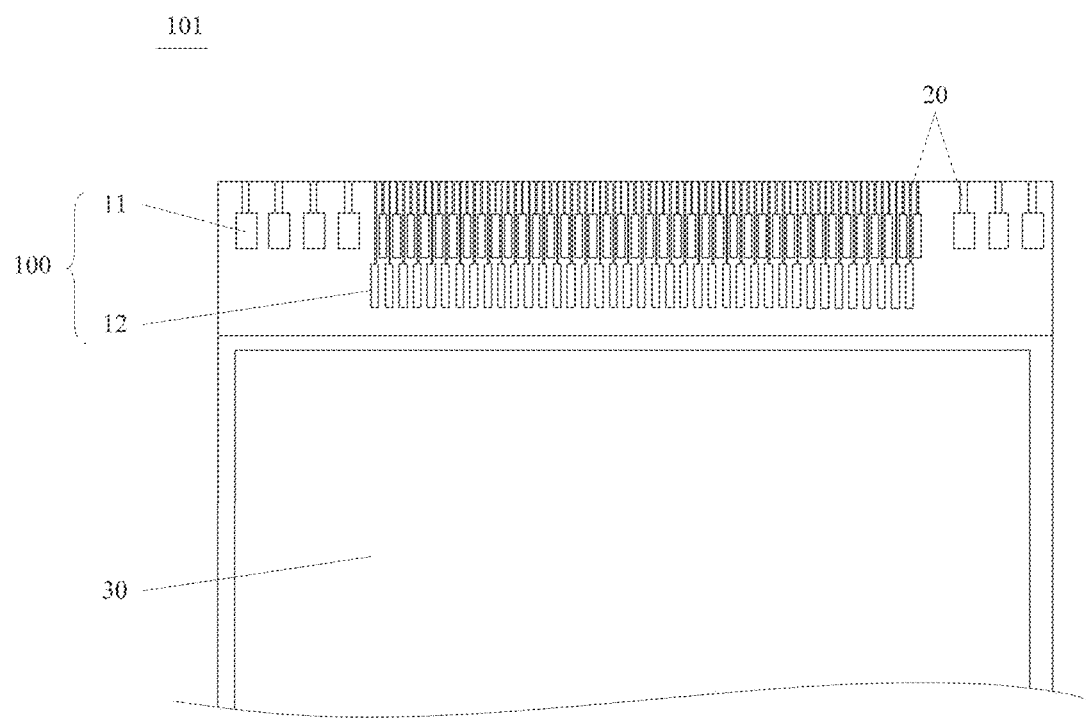
FIG. 4 is a schematic diagram showing a partial structure of a separate display panel cut from the display motherboard in FIG. 2.

In addition, a structure of the separate display panel 101 formed after cutting is shown in FIG. 4. The display panel 101 includes the conductive connectors 100 and the leads 20. Of course, the display panel 101 further includes a multilayer structure 30 located in a display area of the display panel 101. The multilayer structure 30 includes a thin film transistor (TFT) array structure layer and a display layer (such as a liquid crystal layer or a light-emitting layer). In addition, in a case where the display panel is an organic light-emitting diode (OLED) display panel, the display panel 101 further includes structural layers, such as a thin film encapsulation layer.

Based on this, one conductive connector 100 corresponds to one lead 20. One end of each lead 20 is connected to a corresponding conductive connector 100, and another end thereof extends to a cutting edge of the display panel 101 formed after cutting by the first laser beam.

In this case, after S101, there are a plurality of short-circuited leads 20 at the cutting edge of the display panel 101 formed after the cutting, which are not processed temporarily.

FIG. 4 only shows one possible arrangement and an exemplary number of the conductive connectors 100. A specific arrangement and the number of the conductive connectors 100 may be flexibly adjusted according to design parameters such as a size of the display panel. FIG. 4 only shows an example in which the conductive connectors 100 are the detection terminals 11 and/or the bonding electrodes 12. The conductive connectors 100 may further include other conductive structures provided in a Pad region of the display panel 101 outside the display area, which is not limited in embodiments of the present disclosure.

Figure 6:
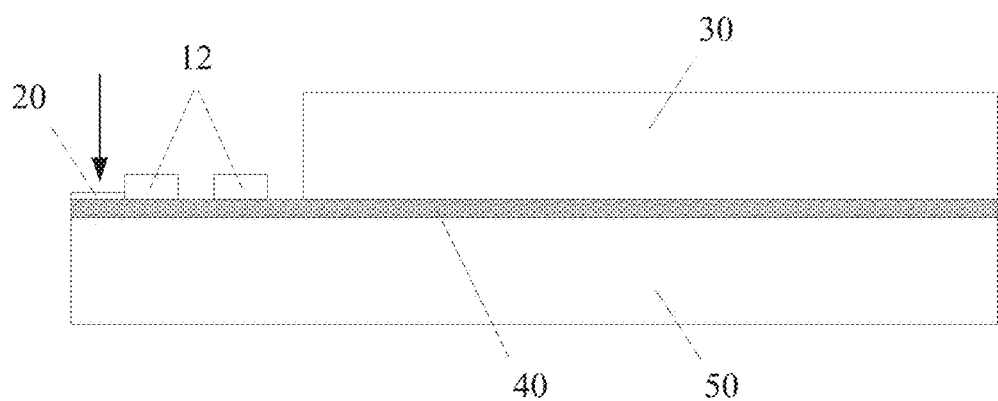
FIG. 6 is a cross-section diagram of structures of the display panel in FIG. 5 before cutting by a second laser beam.

In S102, severe at least short-circuited leads 20 by using a second laser beam (shown by the black arrow in FIG. 6) at a position on the display panel 101 proximate to a position where the display motherboard 01 is cut by using the first laser beam. A position where the lead 20 is severed is marked as c in FIG. 7.

Figure 5:
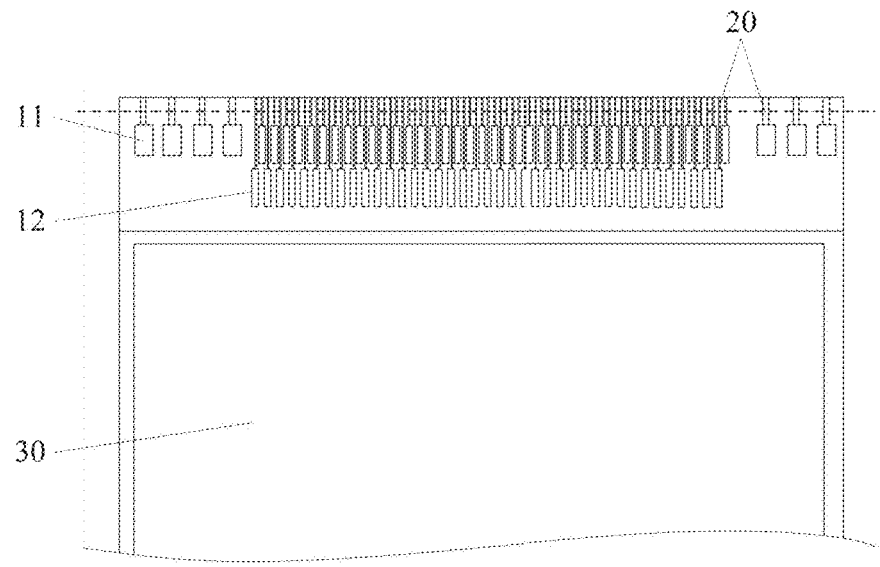
FIG. 5 is a schematic diagram showing a cutting manner in which leads in a separate display panel are severed by using a second laser beam in a cutting method for a display panel, in accordance with some embodiments of the present disclosure.

As shown in FIG. 5, a cutting direction of the second laser beam (shown by the dotted line in FIG. 5) is perpendicular to an extending direction of the leads 20.

In some embodiments of the present disclosure, S102 may include severing all the leads 20 by using the second laser beam at the position on the display panel 101 proximate to the position where the display motherboard 01 is cut by using the first laser beam, wherein severing positions of all the leads 20 are on a same straight line. In this way, there is no need to determine whether leads 20 that are proximate to the position where the display motherboard 01 is cut by using the first laser beam are short-circuited. In addition, during the cutting process, a laser for emitting the second laser beam is moved from one end of the display panel 101 to another end of the display panel 101, so that the servering positions of all the leads 20 are on the same straight line, thereby simplifying a cutting process of the leads 20.

In some embodiments of the present disclosure, by selecting appropriate setting parameters for the second laser beam, energy of the second laser beam may be made only to be capable of severing the leads 20, but not to be enough to sever a base film layer 40 below the leads 20. As a result, the adjacent leads that are welded together and short-circuited are severed. That is, a display panel 101 formed after the cutting by the first laser beam is trimmed by using the second laser beam, and a large amount of carbonized dust will not be generated.

In some embodiments of the present disclosure, the energy of the second laser beam may be less than the energy of the first laser beam. The energy of the second laser beam is limited, and is only capable of severing the leads 20 made of a metal material. Therefore, a degree of carbonization of the base film layer 40 below the leads 20 caused by heat is very low, and an amount of metal debris generated from the severed leads 20 is so small that the severed leads 20 may not be welded together to cause short-circuits again.

In summary, in the cutting method for the display panel provided by some embodiments of the present disclosure, a laser trimming process for the leads 20 is applied to the display panel cut by using the first laser beam, and the leads 20 are merely severed along the direction perpendicular to the extending direction of the leads 20 by using the second laser beam. As a result, the adjacent leads 20 that are welded together and short-circuited after the cutting by the first laser beam are separated, which reduces a degree of poor display due to the short circuits of the leads 20 at the edge of the display panel 101, and improves a product yield of the display panel formed after cutting.

In addition, in a case where a conductive connector 100 connected to one end of a lead 20 is a bonding electrode 12, since the leads 20 are usually disposed along an X-axis direction of a coordinate system located in a plate-like plane of the display motherboard 01, it is easy for the leads 20 which are short-circuited to bring a poor display along the X-axis direction to the display panel 101 formed after the cutting, that is, an undesirable phenomenon of X dark lines are easy to appear in the display panel 101 formed after the cutting. By using the cutting method provided by some embodiments of the present disclosure, the X dark lines due to the short-circuits of the leads 20 at the edge of the display panel 101 may be decreased or further completely eliminated, thereby improving the undesirable phenomenon of the X dark lines and further improving the display quality of display panel.

On the above basis, in a case where the display motherboard 01 is a flexible display motherboard, the display panels formed after cutting are flexible display panels. In this case, a base of the flexible display motherboard is usually a polyimide (PI) film and/or a polyethylene terephthalate (PET) film. Therefore, a flexible base is melted and carbonized more seriously at the cutting edge after being subjected to the high-energy laser beam, and it is more likely to cause adjacent leads 20 at cutting positions to be short-circuited and welded. However, through the cutting method for the display panel provided by the embodiments of the present disclosure, the leads 20 that are melted together may be severed, and the short circuits of the leads 20 may be avoided, thereby improving a yield of the flexible display panel.

The flexible display motherboard includes the multilayer structure 30, and the display layer in the multilayer structure 30 is a light-emitting layer or an organic light-emitting layer.

Figure 7:
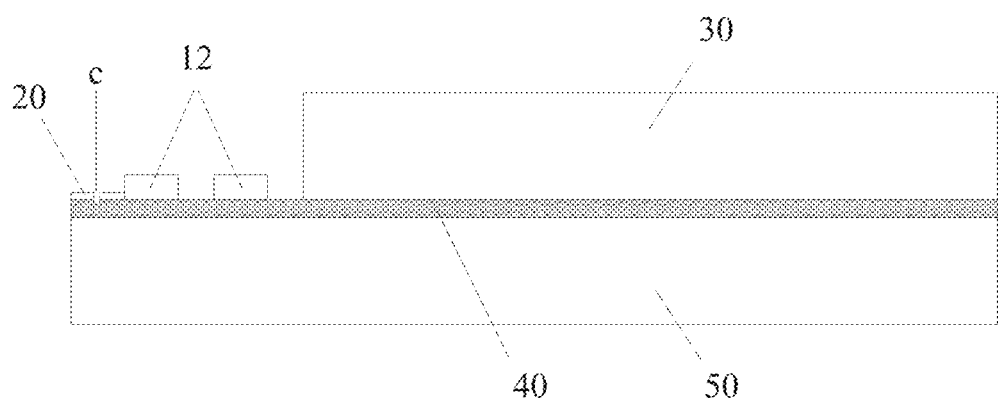
FIG. 7 is a cross-section diagram of structures of the display panel in FIG. 5 after cutting by a second laser beam.

Referring to FIG. 7, the conductive connectors 100 (only two bonding electrodes 12 are illustrated in FIG. 7) and leads 20 are formed on a surface of the base film layer 40. In order to reduce an adjustment error of the parameters of the second laser beam, a cutting depth of the second laser beam may be extended slightly downward, so as to enlarge an adjustment range of the parameters of the second laser beam.

It will be noted that, the above "downward" direction refers to a direction pointing from a lead 20 to the base film layer 40 used as the base.

The parameters of the second laser beam need to satisfy the following conditions. That is, the cutting depth of the second laser beam is greater than or equal to a thickness of a lead 20 and is less than a sum of the thickness of the lead 20 and a thickness of the base film layer 40 below the lead 20. In this way, the cutting depth of the second laser beam only need to be greater than or equal to the thickness of the lead 20 to ensure that each lead 20 is normally segmented, which may ensure that the lead 20 is severed by using the second laser beam and avoid the base film layer 40 not to be severed.

It will be noted that, the "thickness" of the lead 20 is a distance from a surface of the lead 20 away from the base film layer 40 to the surface of the base film layer 40.

In some embodiments of the present disclosure, the thickness of the lead 20 made of a metal material may be in a range of 1 μm to 2 μm. In a case where the thickness of the lead 20 is less than 1 μm, a manufacturing accuracy will be increased, which is not conducive to reducing costs of the product. In a case where the thickness of the lead 20 is greater than 2 μm, a thickness of the display panel 101 will be increased, which is not conducive to an ultra-thin design trend of the display panel. In some embodiments of the present disclosure, the thickness of the lead 20 may be 1.3 μm, 1.5 μm, 1.8 μm, or the like. In this case, a setting of the parameters of the second laser beam makes the cutting depth thereof greater than the above 1 μm to 2 μm and extend slightly downward, so as to ensure that each lead 20 is completely segmented.

In addition, as shown in FIG. 7, in the case where the display motherboard to be cut 01 is a flexible display motherboard, the base film layer 40 is a flexible organic film layer, which, for example, is made of a PI material. Since a texture of the base film layer 40 is very soft, in order to facilitate to form the multilayer structure 30 above the base film layer 40, a PET base 50 with a thickness greater than the thickness of the base film layer 40 is further disposed below the base film layer 40 to provide support.

In some embodiments of the present disclosure, according to output manners of laser beams, the laser beams may be classified into a continuous laser beam with a continuously output and a pulsed laser beam with a discontinuously output.

A cutting manner of the continuous laser beam may cause a continuous heat input to a material to be cut to become an excessive heat input, thereby affecting a cutting quality and a dimensional accuracy. An output of the pulsed laser beam is discontinuous. Compared with the continuous laser beam, the pulsed laser beam has a higher control precision. In addition, more importantly, a cutting principle of the pulsed laser beam is to reduce heat of the material to be cut to the minimum. A cutting manner of the pulsed laser beam is a manner of breaking a molecular structure, and energy provided to the material to be cut is very low. Therefore, the pulsed laser beam may perform a processing with a high cutting quality and a good dimensional accuracy. The shorter a pulse width of the pulsed laser beam is, the smaller a thermal effect it has. In a case where the above cutting manner is applied to the trimming process of the leads 20 in the flexible display panel 101, a secondary melting phenomenon of film layers may not occur, and a repairing yield of the short-circuited leads may further be improved.

Therefore, in some embodiments of the present disclosure, the second laser beam may be the pulsed laser beam, and may be, for example, a green laser beam or an ultraviolet (UV) laser beam, Wavelengths of the green laser beam and the UV laser beam are usually 532 nm and 355 nm, respectively. Compared with an ordinary infrared laser beam (a wavelength of which is usually 1064 nm), the green laser beam and the UV laser beam have smaller wavelengths and greater laser energy, and have advantages of smaller laser spots and more concentrated energies after focusing.

Or, the pulsed laser beam used as the second laser beam may be a picosecond pulsed laser beam with a higher accuracy.

A width of the picosecond pulse may be compared with an electro-optical relaxation time, and is short enough to make the picosecond pulsed laser beam perform a cold ablation on the material to be cut and not generate a hot melting, thereby further ensuring that the adjacent leads 20 are not welded together again after cutting by the second laser beam, which makes a segmented cutting accuracy of the leads 20 higher.

The picosecond pulsed laser beam may be a picosecond green laser or a picosecond UV laser beam.

Some embodiments of the present disclosure provide a display panel 101 obtained by using the above cutting method. The leads 20 that are used for connection and leaded from the conductive connectors 100 in the display panel 101 have breaks along a direction perpendicular to an extending direction of the leads 20. The display panel 101 has same technical effects as the cutting method for the display panel provided by the foregoing embodiments, and details are not described herein again.

As will be seen from the above, the conductive connectors 100 include bonding electrodes 12 for bonding circuit structures and/or detection terminals 11 for electrical detections.

The thickness of the lead 20 is in a range of 1 μm to 2 μm.

Some embodiments of the present disclosure provide a display device, which includes the display panels formed after the cutting provided by the foregoing embodiments.

The display device may be any product or component having a display function such as a display, a television, a digital photo frame, a mobile phone, a tablet computer or a navigator.

In a case where the display panel is a flexible display panel, the display device may be a flexible OLED display device. In some embodiments of the present disclosure, the display device may be a wearable OLED display device, such as a smart bracelet or a smart watch. The display device has the same technical effects as the display panel provided by the foregoing embodiments, and details are not described herein again.

The above descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A cutting method for a display panel, wherein the cutting method comprises:
   cutting a display motherboard to be cut into a plurality of separate display panels by using a first laser beam, wherein the display panels each include a plurality of leads disposed between conductive connectors and a cutting edge of the display panel formed after cutting by the first laser beam; and
   severing at least some leads of the display panel by using a second laser beam at a position on the display panel between the conductive connectors and the cutting edge of the display panel, the at least some leads being short-circuited leads; wherein
   a cutting direction of the second laser beam is perpendicular to an extending direction of the leads; and
   a cutting depth of the second laser beam is greater than a thickness of the leads, and is less than a sum of the thickness of the leads and a thickness of a base film layer on which the conductive connectors and the leads are formed.

2. The cutting method for the display panel according to claim 1, wherein energy of the second laser beam is less than energy of the first laser beam.

3. The cutting method for the display panel according to claim 1, wherein severing the at least some leads of the display panel by using the second laser beam at the position on the display panel between the conductive connectors and the cutting edge of the display panel, includes:
   severing all the leads by using the second laser beam at the position on the display panel between the conductive connectors and the cutting edge of the display panel, wherein severing positions of all the leads are on a same straight line.

4. The cutting method for the display panel according to claim 1, wherein cutting the display motherboard to be cut into a plurality of separate display panels by using the first laser beam, includes:
   cutting the display motherboard to be cut into a plurality of separate display panels along cutting paths on the display motherboard by using the first laser beam.

5. The cutting method for the display panel according to claim 1, wherein the second laser beam is a pulsed laser beam.

6. The cutting method for the display panel according to claim 5, wherein the pulsed laser beam is a picosecond pulsed laser beam, a green laser beam or an ultraviolet laser beam.

7. The cutting method for the display panel according to claim 1, wherein the display motherboard to be cut is a flexible display motherboard, and the plurality of separate display panels are flexible display panels.

* * * * *